United States Patent [19]

Greenberg

[11] Patent Number: 5,477,487
[45] Date of Patent: Dec. 19, 1995

[54] AUDIO AUTO-REPEATING DEVICE AND METHOD

[76] Inventor: Richard E. Greenberg, 16795 Edgar St., Pacific Palisades, Calif. 90272

[21] Appl. No.: 293,866

[22] Filed: Aug. 22, 1994

[51] Int. Cl.$^6$ ................................................ H04B 1/16
[52] U.S. Cl. ............................................ 365/189.01
[58] Field of Search .................. 365/189.01, 230.01; 355/6.3, 334, 899

[56] References Cited

U.S. PATENT DOCUMENTS 4,105,864  8/1978  Berkovitz ......................... 197/1

FOREIGN PATENT DOCUMENTS 62-294356  12/1987  Japan .

1-68026  3/1989  Japan .

*Primary Examiner*—Viet Q. Nguyen
*Attorney, Agent, or Firm*—Sprung Horn Kramer & Woods

[57] ABSTRACT

A method and device for repeating an audible segment for use in an audio apparatus wherein an audio signal is converted into audible sounds. The audio signal is received via memory which continuously stores a predetermined time segment thereof and which is able to read out the stored audio signal segment at an output thereof. A manually actuatable switch is operable upon manual actuation by a user for maintaining the storage of a predetermined time segment of the audio signal immediately before the manual actuation and for reading out the stored audio signal at least once after the manual actuation. The read out stored audio signal is directed to an output device so that it can be heard by the user.

12 Claims, 5 Drawing Sheets

AUDIO AUTO-REPEATING DEVICE AND METHOD

BACKGROUND OF THE INVENTION

The invention is directed to a method and device for automatically repeating an audible segment from an audio device.

Audio devices, such as radios, can be found in cars, work places and in the home. In those environments, there are momentary distractions which cause the listener to miss a segment of a broadcast.

SUMMARY OF THE INVENTION

The main object of the present invention is to provide a device and method that, through constant real time recording, allows a user to replay a segment of audio that has been amplified or reproduced through a radio receiver, telephone or other sound amplification or transmission device.

The present invention can be installed in almost any audio or video device which has an audio output. A preferable embodiment of the present invention is its use in a radio where it can be used by a listener to repeat a segment of a broadcast that he or she has just missed. It allows the listener to ask "what?" of the device, and if manually actuated in a reasonable period of time, i.e., within a few seconds of the missed statement, to repeat exactly what had been broadcast in the moments before the manual actuation. The present invention is especially well suited for use in an automobile where the driver is often distracted during important broadcast moments like traffic reports, telephone numbers or sports scores.

The present invention can also be used in a telephone to record and store numbers as they are recited into the phone.

In accordance with the present invention, the device is inserted into the audio path between the audio output device, such as a speaker, and the audio signal normally applied thereto. The present invention continuously stores a predetermined time segment of the audio signal and is able to read out a stored audio segment at an output thereof.

A manually actuatable means, preferably a pushbutton accessible by the user, is operative upon manual actuation by a user to maintain the storage of the predetermined time segment of the audio signal immediately before the manual actuation and for reading out the stored audio signal at least once after manual actuation. The stored audio signal, which is read from the memory, is directed into the audio output device so it can be heard by the user.

These and other features of the present invention will be described in more detail in the following detailed description taken with the attached drawings, wherein:

DETAILED DESCRIPTION OF THE INVENTION

Figure 1:
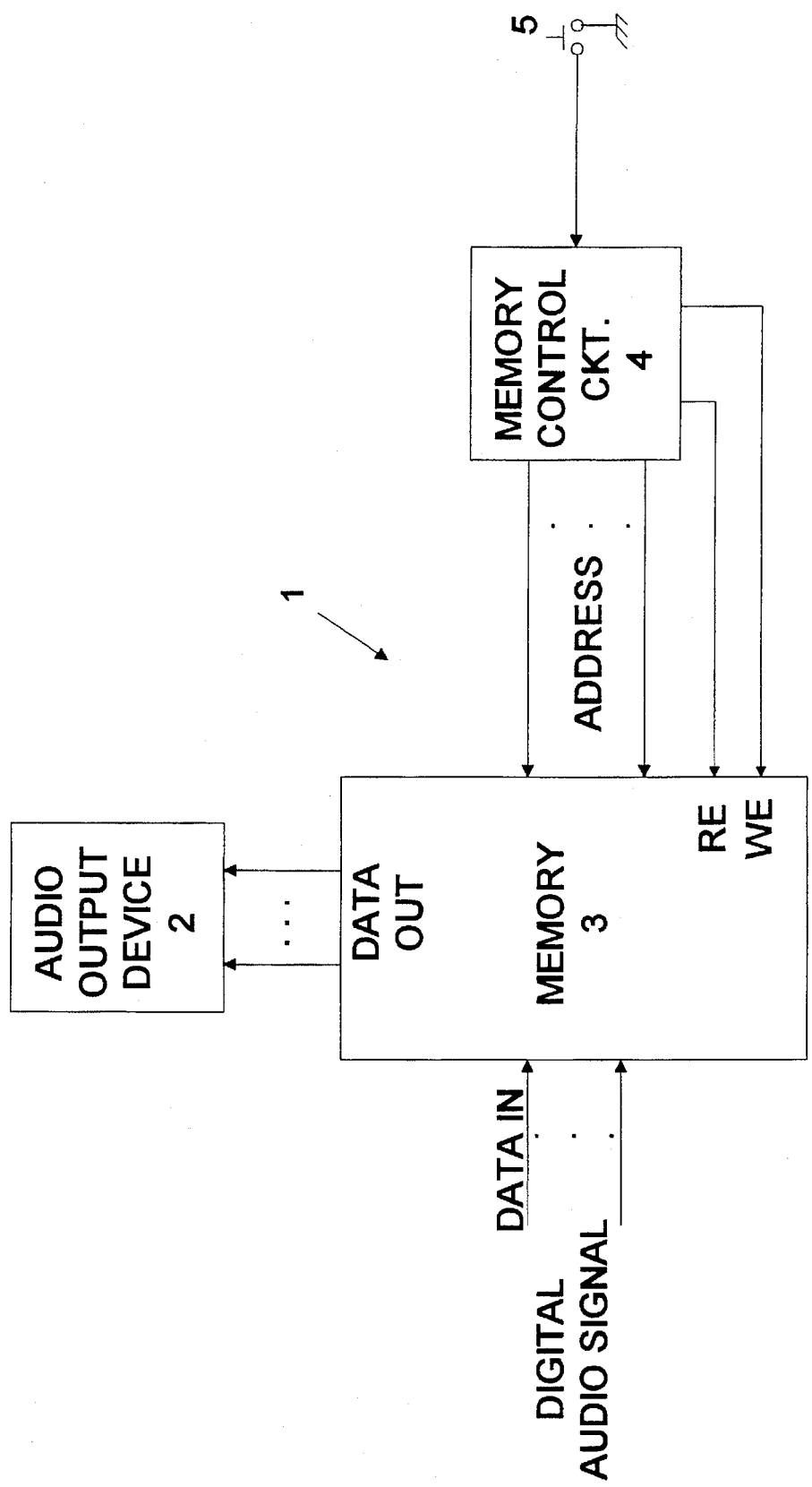
FIG. 1 is a block diagram of a device according to the present invention.

Referring now to FIG. 1, the device 1 according to the present invention is situated between a digital audio signal and an audio output device 2 normally contained in a radio, telephone or other audio. device and which can be a speaker or the like.

The digital audio signal is applied to the data inputs of a memory 3 which is preferably a semi-conductor memory which also has data outputs, address inputs and a read enable and write enable input. The memory can be a static or dynamic random access memory.

In the embodiment of FIG. 1, the memory control circuit comprises a counter which continuously cycles through the addresses of memory 3. Given that approximately 5 seconds of audio, sampled at a rate of 22 KHz, can be stored uncompressed in 110 kilobytes of memory, the memory 3 should be configured to store preferably 5 to 30 seconds, most preferably 15 seconds and thus be from 100 to 600 kilobytes in size. This would require 20 address bits and thus a 20 bit counter in the memory control circuit 4.

In normal use, the memory control circuit 4 enables the write enable input so that the digital audio signal is continuously written into the memory 3 and stored and the memory control circuit 4 also enables the read enable input so that each digital audio signal stored in the memory 3 is also read out and applied to the audio output device 2.

Upon the actuation of pushbutton 5 by the user, the memory control circuit 4 need only disable the write enable input to memory 3 so that the memory 3 will now continuously read the data stored in memory 3 for each of the $2^{20}$ addresses. This will result in the 15 second segment just prior to the actuation of pushbutton 5 to be read out of memory 3 at least once and applied to the audio output device 2 so as to repeat that segment for as many times as the user desires. The reactuation of the pushbutton 5 returns the write enable input to its original condition and all digital audio signals thereafter will be stored in memory 3 and applied to the audio output device 2. Thus the stored segment keeps looping until the pushbutton is again actuated.

Figure 2:
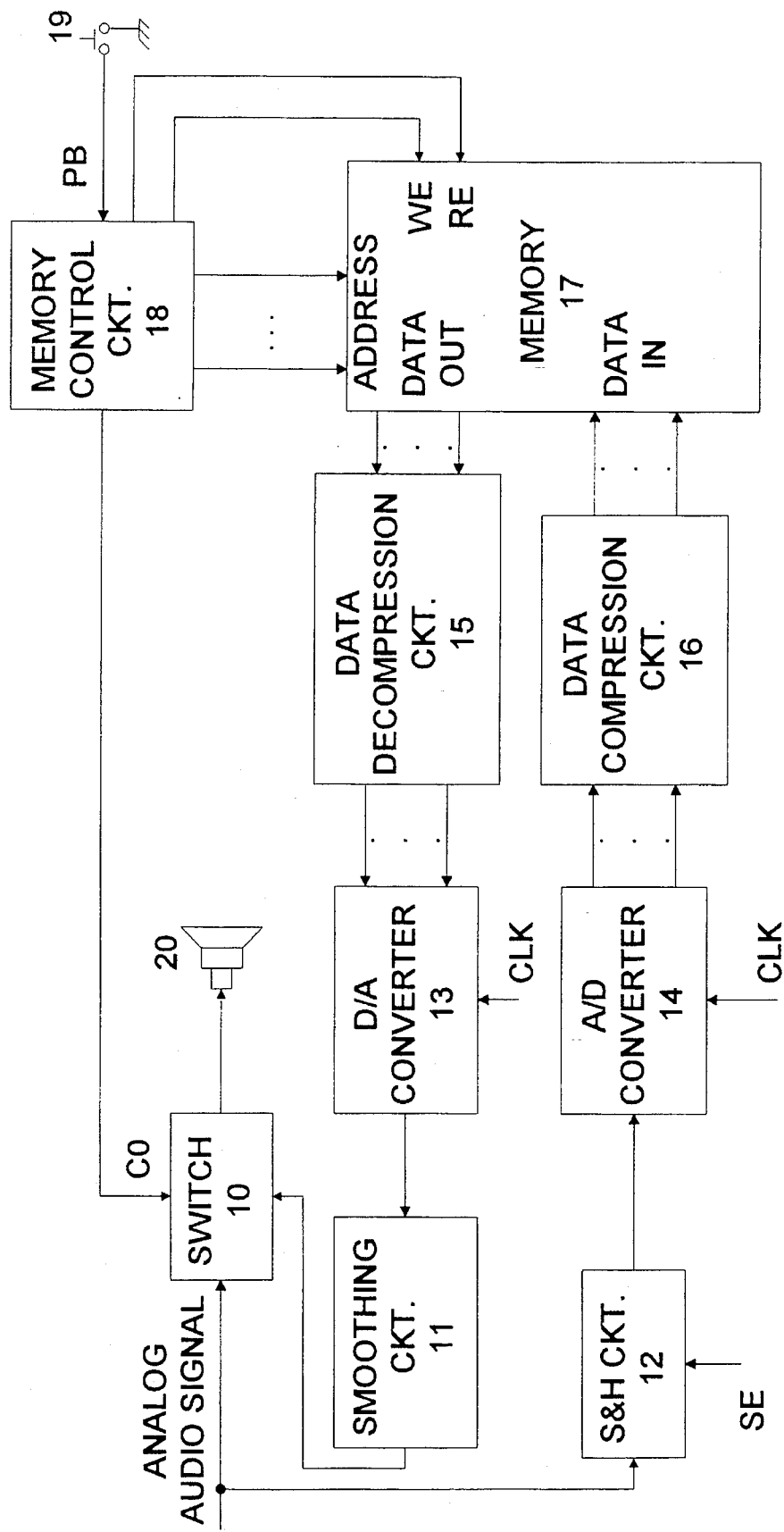
FIG. 2 is a block diagram of another embodiment of the present invention.

FIG. 2 shows another embodiment of the present invention wherein an analog audio signal is present and which is normally applied to a speaker 20. Interposed between the analog audio signal and the speaker 20 is an analog switch 10 which is under the control of memory control circuit 18 via signal CO. The analog audio signal is also applied to a sample on hold circuit 12 which is actuated by a sample enable signal SE and the output of the sample on hold circuit 12 is applied to an analog to digital converter 14 under control of a clock signal CLK, and the output of the analog to digital converter 14 is applied to a data compression circuit 16 and thereafter to the input of memory 17. Memory 17 is controlled by the memory control circuit 18 which applies a write enable signal WE and read enable signal RE thereto, as well as address inputs as shown. The memory 17 has data output pins attached to a data decompression circuit 15 whose output is thereafter applied to a digital to analog converter 13 under the control of clock signal CLK and the output of the digital to analog converter 13 is applied to a smoothing circuit 11 and thereafter into the analog switch 10.

In operation, until a pushbutton 19 is actuated by a user, the switch 10 is controlled by the memory control circuit 18 to apply the analog audio signal directly to the speaker 20. The analog audio signal is also sampled in the sample and hold circuit 12, converted into a digital signal in A/D converter 14, compressed to save memory and stored in memory 17 as in the embodiment of FIG. 1. The read enable is not actuated.

Upon actuation of the pushbutton 19, the memory control circuit 18 enables the read enable input and disables the write enable input to memory 17 and switches switch 10 under the control of signal C0 so that the switch 10 applies the input from the smoothing circuit 11 to the speaker 20. Data from memory 17 is decompressed in the decompression circuit 15, converted to an analog signal in D/A converter 13 and smoothed in smoothing circuit 11 and thereafter applied to switch 10. The memory control circuit 18 cycles through the addresses, as in the embodiment of FIG. 1, and thereafter the segment stored in memory 17 will be repeated as many times as desired by the user until the pushbutton 19 is again manually actuated and the switch 10 switches over to applying the analog audio signal to the speaker 20.

Figure 3:
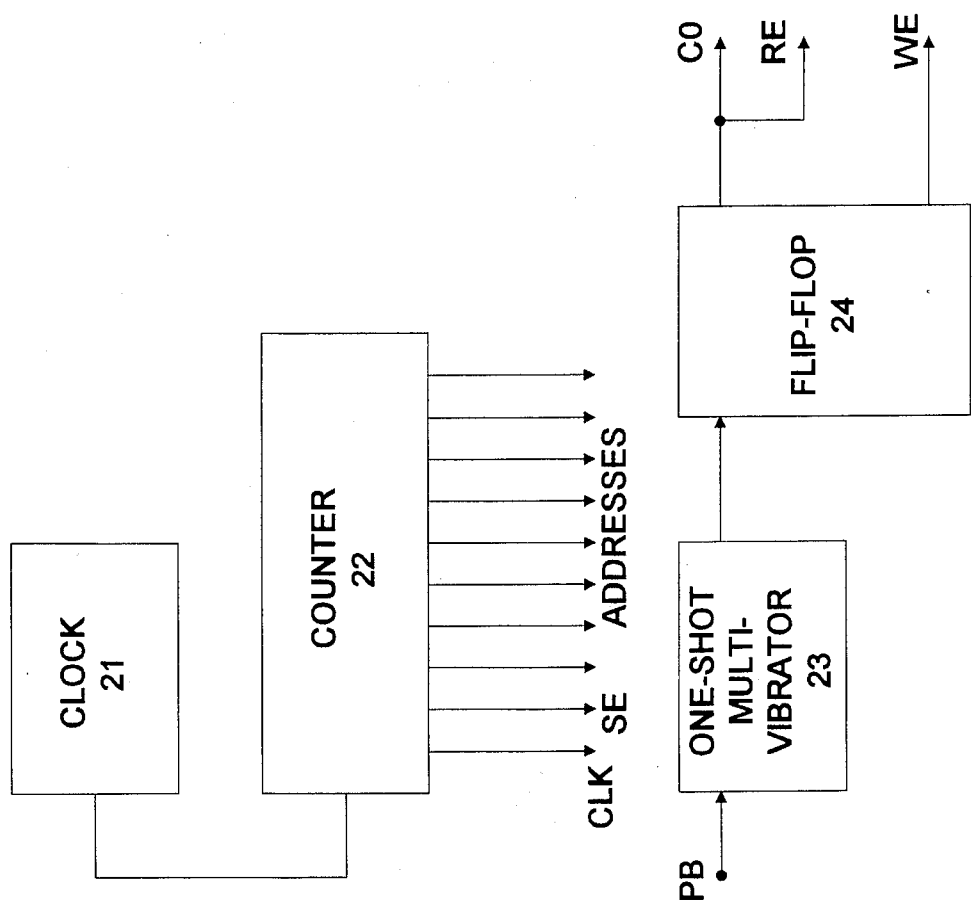
FIG. 3 is a schematic of the memory control circuit of FIG. 2.

FIG. 3 shows the circuitry used in the memory control circuit 18 for carrying out the functions described hereinabove with regard to FIG. 2.

As shown in FIG. 3, a clock 21 has its output applied to the input of counter 22 which generates a number of counting signals, the fastest being used as the clock signal CLK, the next highest frequency being used as the sample enable signal SE and the following clock signals being used as the address inputs to memory 17.

The pushbutton 19 generates a signal PB which is applied to a one-shot-multi-vibrator 23 to generate a single pulse each time the pushbutton is depressed. The output of the multi-vibrator 23 is applied to a flip-flop 24 with one output being used to generate the CO and RE pulse and another output to generate the WE signal.

Figure 4:
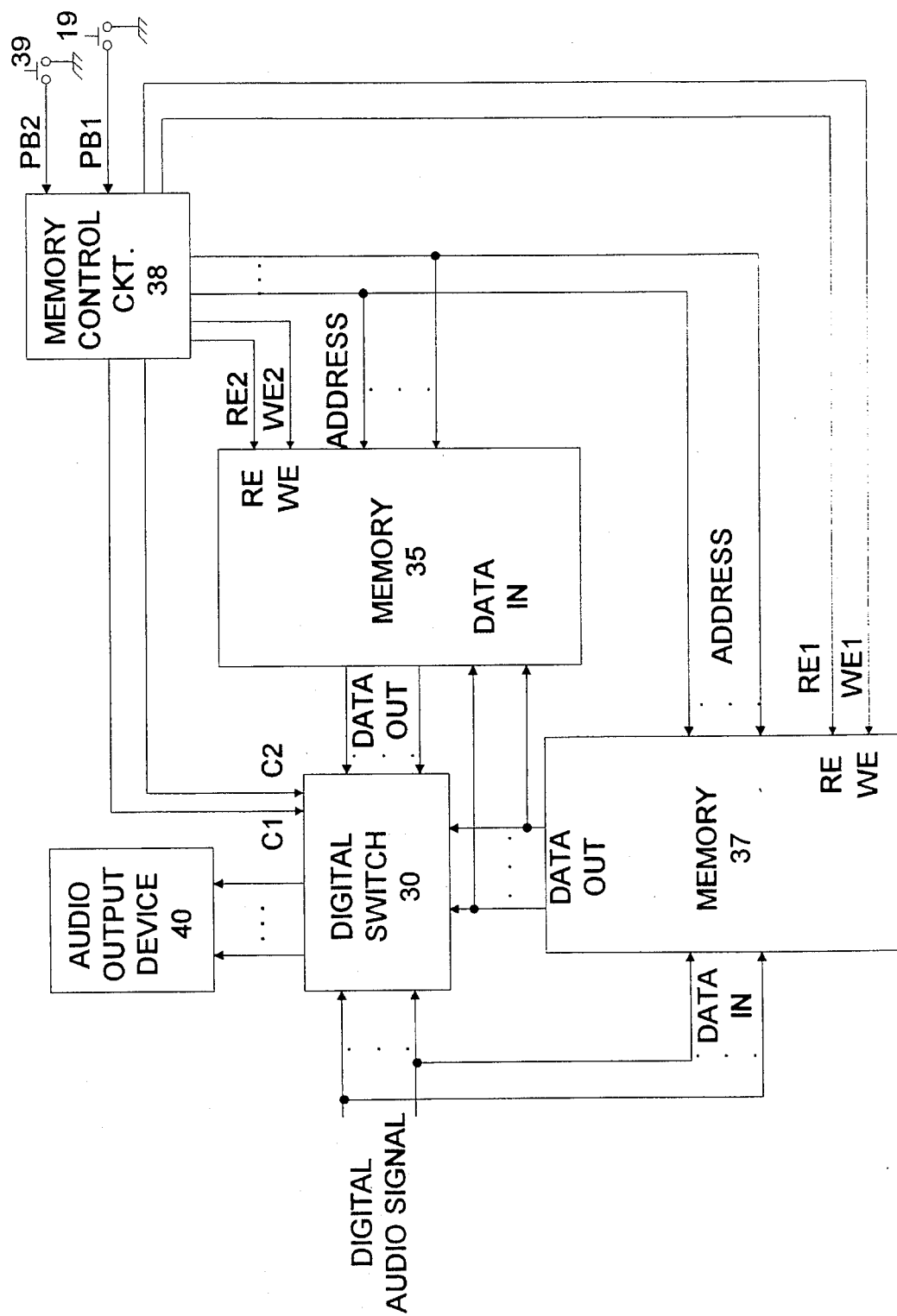
FIG. 4 is a block diagram of a further embodiment of the present invention.
Figure 5:
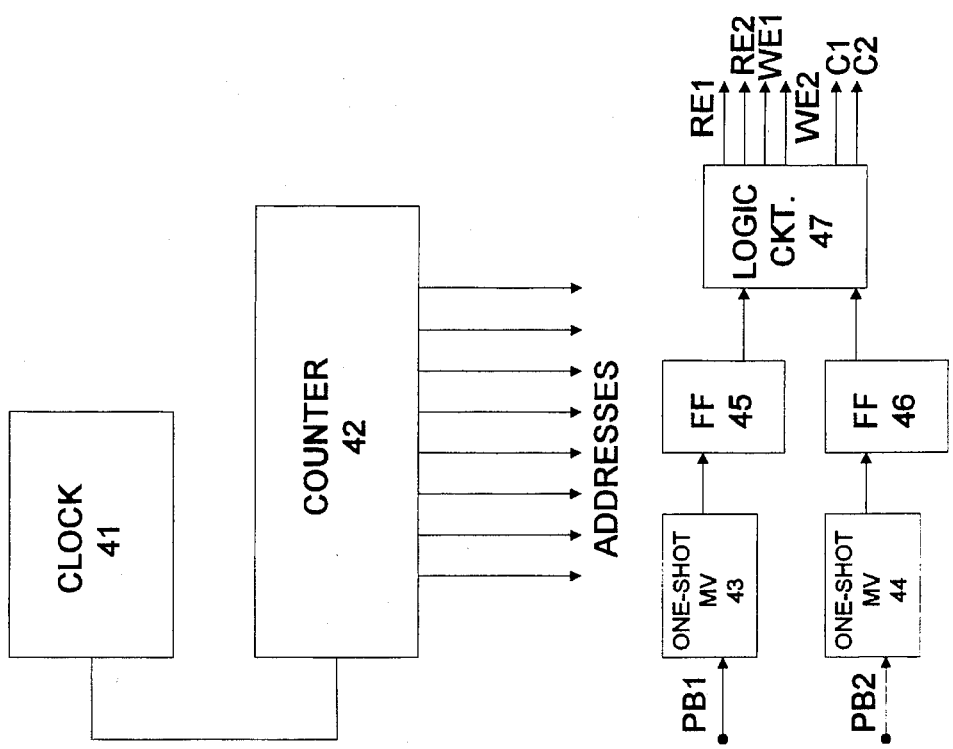
FIG. 5 is a schematic of the memory control circuit of FIG. 4.

FIGS. 4 and 5 illustrate another embodiment of the present invention wherein a digital audio signal is available as the input and an audio output device 40 is present into which the digital audio signal is normally connected.

A digital switch 30 is applied between the digital audio signal and the audio output device 40 and this switch 30 is under the control of memory control circuit 38. A first memory 37 has as its input the digital audio signal and applies its output to one set of inputs of digital switch 30 and to the data input of a second memory 35 whose output is also applied as another input to the digital switch 30. The digital switch 30 selects which of the three inputs is to be applied to the audio output device 40 under the control of control signal C1 and C2 from memory control circuit 38. The memory control circuit 38 also applies address inputs to memories 37 and 35, as well as read and write enable signals RE1,WE1 and RE2,WE2 to memories 37 and 35 respectively.

The memory control circuit 38 is under the control of two manually actuatable switches including pushbutton 19 as described in the previous embodiment and pushbutton 39. The pushbuttons 19 and 39 generate signals PB1 and PB2 as shown in FIG. 4 and the structure of the memory control circuit 38 is described in more detail with regard to FIG. 5.

As shown therein, a clock 41 is attached to counter 42 so that it generates the various address signals for application to the two memories.

Signals PB1 and PB2 are applied to one-shot multi-vibrators 43 and 44 respectively and whose outputs are applied to the inputs of flip-flops 45 and 46. The outputs of flip-flops 45 and 46 are applied to a logic circuit 47 which generates the control signals and the read and write enable signals as necessary and summarized in Table 1 below.

TABLE 1

|     | NONE | PB1 | PB1 | PB1 | PB2 | PB1 | PB2 | PB1 |
| --- | --- | --- | --- | --- | --- | --- | --- | --- |
| C1  | 0 | 1 | 0 | 1 | 1 | 0 | 0 | 0 |
| C2  | 0 | 0 | 0 | 0 | 0 | 0 | 1 | 0 |
| RE1 | 0 | 1 | 0 | 1 | 1 | 0 | 0 | 0 |
| RE2 | 0 | 0 | 0 | 0 | 0 | 0 | 1 | 0 |
| WE1 | 1 | 0 | 1 | 0 | 0 | 1 | 0 | 1 |
| WE2 | 0 | 0 | 0 | 0 | 1 | 0 | 0 | 0 |

The operation of the circuit of FIG. 4 with regard to the Table 1 will now be described.

When neither of the pushbuttons are manually actuated by the user, the signals are such that only data is being written into memory 37, and it continuously stores the digital audio signal, which is directly applied by the digital switch 30 to the audio output device 40 based upon the status of control signals C1 and C2.

When pushbutton 19 is depressed, the control signal C1 changes state, and the read enable signal RE1 is activated so that memory 37 now reads out whatever is stored therein and will repeat the readout as many times as desired by the user. The output from the memory 37 is applied by digital switch 30 to the output audio device 40 due to the change in the state of control signal C1.

The circuit will remain in this state until pushbutton 19 is again depressed whereupon digital control signal C1 is returned to its original state, digital switch 30 applies the digital audio signal to the output device 40 and memory 37 is again enabled to store the digital audio signal on a continuous basis.

In the situation where the user desires to permanently store a particular audio segment, the operation of memory 35 comes into play as will be described. In this situation, pushbutton 19 is again actuated, as in the previous example, with the result as previously described. Instead of resetting the system as described hereinabove, pushbutton 39 is now actuated, whereupon the write enable signal WE2 for memory 35 is activated and the data read out of the memory 37 is now stored in memory 35. After as much of the repeated audio segment is stored in memory 35 as is desired by the user, pushbutton 19 is again pressed and the system resets to its original state wherein the digital audio signal is continuously stored in memory 37. However, memory 35 has the last segment stored therein for later use.

This later use can be achieved by thereafter pressing pushbutton 39, whereupon control signal C2 is activated as well as read enable signal RE2 so that the output of memory 35 is applied by digital switch 30 to the audio output device 40 and will be repeated as many times as desired by the user. The system can then be reset to its original state by pressing pushbutton 19.

Those of skill in the art will recognize that other memories such as shift register memories, bubble memories, static and dynamic random access memories, etc. can be used in the present invention. Similarly, switches other than pushbutton switches, such as micro switches, toggle switches, capacitive switches, diaphragm switches, voice actuated switches, etc. can be used for manual actuation herein.

It is understood that the embodiments described hereinabove are merely illustrative and are not intended to limit the scope of the invention. It is realized that various changes, alterations, rearrangements and modifications can be made by those skilled in the art without substantially departing from the spirit and scope of the present invention.

What is claimed is:

1. A device for repeating an audible segment for use in an audio apparatus wherein an output circuit is receptive of an audio signal for converting the audio signal into audible sounds, the device comprising: a memory receptive of an audio signal for continuously storing a predetermined time segment thereof and for reading out a stored audio signal segment at an output thereof; and a manually actuatable switch operative upon manual actuation by a user for maintaining the storage of said predetermined time segment of the audio signal by said memory immediately before the manual actuation and for reading out the stored audio signal at least once after said manual actuation; and circuitry for directing the read out stored audio signal to the output circuit.

2. The device according to claim 1, wherein the manually actuatable switch comprises a pushbutton switch.

3. The device according to claim 1, wherein the circuit for directing the stored output signal to the output circuit comprises an analog switch.

4. The device according to claim 1, wherein the circuit for directing the stored output signal to the output circuit comprises a digital switch.

5. The device according to claim 1, wherein the memory comprises a random access memory.

6. The device according to claim 1, wherein the memory comprises two memories, wherein the manually actuatable switch comprises two switches and wherein the circuit for directing the stored audio signal to the output circuit comprises a circuit for selecting between the outputs of the two memories dependent upon the order of actuation of the two switches.

7. A method for repeating an audible segment, the method comprising the steps of: continuously storing a predetermined time segment of an audio signal; manually actuating a switch; maintaining the storage of said predetermined time segment of the audio signal immediately before the manual actuation of the switch; reading out the stored audio signal at least once after said manual actuation; and directing the read out stored audio signal to an output circuit.

8. The method according to claim 7, wherein the step of manually actuating comprises pushing a pushbutton switch.

9. The method according to claim 7, wherein the step of directing the stored output signal to the output means comprises providing an analog switch.

10. The method according to claim 7, wherein the step of directing the stored output signal to the output means comprises providing a digital switch.

11. The method according to claim 7, wherein the step of storing comprises writing data into a random access memory.

12. The method according to claim 7, wherein the step of storing comprises writing data into two memories, wherein the step of manually actuating comprises providing two switches and wherein the step of directing the stored audio signal to the output means comprises selecting between the outputs of the two memories dependent upon the order of actuation of the two switches.

* * * * *